US010445449B2

(12) United States Patent
Cox et al.

(10) Patent No.: US 10,445,449 B2
(45) Date of Patent: Oct. 15, 2019

(54) SYSTEMS AND METHODS FOR OPTIMIZING BATTERY DESIGNS

(71) Applicant: The Boeing Company, Chicago, IL (US)

(72) Inventors: Kelsea Cox, Harvest, AL (US); Sharon Filipowski Arroyo, Sammamish, WA (US)

(73) Assignee: THE BOEING COMPANY, Chicago, IL (US)

( * ) Notice: Subject to any disclaimer, the term of this patent is extended or adjusted under 35 U.S.C. 154(b) by 182 days.

(21) Appl. No.: 15/350,764

(22) Filed: Nov. 14, 2016

(65) Prior Publication Data

US 2018/0137229 A1     May 17, 2018

(51) Int. Cl.
    *G06F 17/50*      (2006.01)
    *G06Q 10/08*      (2012.01)

(52) U.S. Cl.
    CPC ....... *G06F 17/5045* (2013.01); *G06Q 10/087* (2013.01)

(58) Field of Classification Search
    CPC .......... G06F 17/50; G06F 19/00; G06F 17/30; H01M 10/04; H01M 6/00
See application file for complete search history.

(56) References Cited

U.S. PATENT DOCUMENTS

| | | | | |
|---|---|---|---|---|
| 4,224,383 | A | * | 9/1980 | Taylor ................. H01M 2/1072 429/149 |
| 4,297,639 | A | * | 10/1981 | Branham ......... G01R 19/16542 324/429 |
| 2012/0046776 | A1 | * | 2/2012 | Zhang .................. H01M 10/04 700/106 |
| 2017/0108553 | A1 | | 4/2017 | Ganesan et al. |

OTHER PUBLICATIONS

Katsigiannis, Optimal sizing of small isolated hybrid power systems using tabu search, May 5, 2008, Journal of Optoelectronics and Advanced Materials, vol. 10 No. 5, 1241-1245 (Year: 2008).*

(Continued)

*Primary Examiner* — Omar F Fernandez Rivas
*Assistant Examiner* — Michael Edward Cocchi
(74) *Attorney, Agent, or Firm* — MH2 Technology Law Group LLP

(57) ABSTRACT

Systems, computer readable media, and method concern determining operational parameters of an inventory of components to be included in a battery. The method further includes determining an initial working solution for a battery design layout for the battery. The method also includes determining, based on the initial working solution, one or more possible solutions for the battery design layout utilizing a local search algorithm. The local search algorithm iteratively generates the one or more possible solutions from the initial working solution by swapping components from one or more components assigned to locations in the battery design layout with at least one of other components assigned to locations in the battery design layout and other components remaining in the inventory. The swapping of components is limited by a tabu list.

20 Claims, 9 Drawing Sheets

(56) References Cited

OTHER PUBLICATIONS

Kalinli, Component value selection for active filters using parallel tabu search algorithm, 2004, International Journal of Electronics and Communications, 85-92 (Year: 2004).*

Henderson, The Theory and Practice of Simulated Annealing, Apr. 2006, 288-310 (Year: 2006).*

Dwaine K. Coates et al., "Systems and Methods for Screening and Matching Battery Cells and Electronics", U.S. Appl. No. 14/860,173, filed Sep. 21, 2015.

Kelsea Cox et al., "Systems and Methods for Optimizing Component Placement in a Battery Design," U.S. Appl. No. 15/138,815, filed Apr. 26, 2016.

Extended European Search Report dated Feb. 20, 2018 in corresponding European Application No. 17188178.2 (17 pages).

Adnan et al., "A Modified Tabu Search Approach for the Clustering Problem," Journal of Applied Sciences 11 (1): 3447-3453, 2011 (8 pages).

Chu et al., "A Clustering Algorithm Using the Tabu Search Approach With Simulated Annealing," Data Mining II (2000), pp. 515-523.

Shin et al., "A Statistical Model-based Cell-to-Cell Variability Management of Li-ion Battery Pack," IEEE Transactions on Computer-Aided Design of Integrated Circuits and Systems, vol. 34, No. 2, Feb. 2015, pp. 252-265.

Author Unknown, Wikipedia "Tabu Search," https://en.wikipedia.org/w/index.php?title=Tabu_search&oldid=732792195, downloaded May 2, 2018, 5 pages.

Examination Report dated Aug. 13, 2018 in corresponding EP Application No. 17 166 898.1.

Severino et al., "Multi-objective Optimal Design of Lithium-Ion Battery Packs Based on Evolutionary Algorithms," 2014, Journal of Power Sources, 267, pp. 288-299.

Extended European Search Report dated Aug. 28, 2018 in related EP Application No. 17 16 6898, 14 pages.

Wolf et al., "On Optimizing Sensor Placement for Spatio-Temporal Temperature Estimation in Large Batter Packs," IEEE 51st Annual Conference on Decision and Control, Dec. 10, 2012, pp. 973-978.

Author Unknown, "Mixed-Integer Linear Programming (MILP)—MATLAB intlinprog," MATLAB Documentation, Mar. 20, 2015, pp. 1-28, URL:https://web/archive.org/web/20150320190504/https://mathworks.com/help/optim/ug/intlinprog.html.

* cited by examiner

SYSTEMS AND METHODS FOR OPTIMIZING BATTERY DESIGNS

BACKGROUND

Currently, large-scale batteries can be construed of individual battery cells and electrical components coupled in various electrical arrangements. The large-scale batteries can be formed of modular sub-units consisting of commercial off-the-shelf (COTS) battery cells. The approach of using small cells in large batteries results in a total cell count of hundreds or thousands of cells in the battery. Battery performance, however, can be affected due to variations in individual cell and other battery component performance.

SUMMARY

Aspects of the present disclosure concern a method that includes determining operational parameters of an inventory of components to be included in a battery. The components include storage componeents and electrical components. The method also includes determining an initial working solution for a battery design layout for the battery. The initial working solution includes a set of components from the inventory of components assigned to locations in the battery design layout. Further, the method includes determining, based on the initial working solution, one or more possible solutions for the battery design layout utilizing a local search algorithm. The local search algorithm iteratively generates the one or more possible solutions from the initial working solution by swapping components from one or more components assigned to locations in the batter design layout with at least one of other components assigned to locations in the battery design layout and other components remaining in the inventory. A tabu list stores identifications of one or more components that are not allowed to swap for a number of iterations of the local search algorithm. Objective function values are calculated for each of the one or more possible solutions based on the operational parameters of components assigned to locations in the one or more possible solutions. The swapping of components is determined at least partially based on the tabu list. The method also includes providing, via an interface to a user, a battery build selected from the one or more possible solutions based on the objective function values calculated for the one or more possible solutions.

Additional aspects of the present disclosure concern a system that includes one or more memory devices storing instructions, and one or more processors coupled to the one or more memory devices and configured to execute the instructions to perform a method. The method includes determining operational parameters of an inventory of components to be included in a battery. The components include storage components and electrical components. The method also includes determining an initial working solution for a battery design layout for the battery. The initial working solution includes a set of components from the inventory of components assigned to locations in the battery design layout. Further, the method includes determining, based on the initial working solution, one or more possible solutions for the battery design layout utilizing a local search algorithm. The local search algorithm iteratively generates the one or more possible solutions from the initial working solution by swapping components from one or more components assigned to locations in the battery design layout with at least one of other components assigned to locations in the battery design layout and other components remaining in the inventory. A tabu list stores identifications of one or more components that are not allowed to swap for a number of iterations of the local search algorithm. Objective function values are calculated for each of the one or more possible solutions based on the operational parameters of components assigned to locations in the one or more possible solutions. The swapping of components is determined at least partially based on the tabu list. The method also includes providing, via an interface to a user, a battery build selected from the one or more possible solutions based on the objective function values calculated for the one or more possible solutions.

Additional aspects of the present disclosure concern a non-transitory computer readable medium storing instructions for causing one or more processors to perform a method. The method includes determining operational parameters of an inventory of components to be included in a battery. The components include storage components and electrical components. The method also includes determining an initial working solution for a battery design layout for the battery. The initial working solution includes a set of components from the inventory of components assigned to locations in the battery design layout. Further, the method includes determining, based on the initial working solution, one or more possible solutions for the battery design layout utilizing a local search algorithm. The local search algorithm iteratively generates the one or more possible solutions from the initial working solution by swapping components from one or more components assigned to locations in the battery design layout with at least one of other components assigned to locations in the battery design layout and other components remaining in the inventory. A tabu list stores identifications of one or more components that are not allowed to swap for a number of iterations of the local search algorithm. Objective function values are calculated for each of the one or more possible solutions based on the operational parameters of components assigned to locations in the one or more possible solutions. The swapping of components is determined at least partially based on the tabu list. The method also includes providing, via an interface to a user, a battery build selected from the one or more possible solutions based on the objective function values calculated for the one or more possible solutions.

DETAILED DESCRIPTION

For simplicity and illustrative purposes, the principles of the present teachings are described by referring mainly to examples of various implementations thereof. However, one of ordinary skill in the art would readily recognize that the same principles are equally applicable to, and can be implemented in, all types of information and systems, and that any such variations do not depart from the true spirit and scope of the present teachings. Moreover, in the following detailed description, references are made to the accompanying figures, which illustrate specific examples of venous implementations. Logical and structural changes can be made to the examples of the various implementations without departing from the spirit and scope of the present teachings. The following detailed description is, therefore, not to be taken in a limiting sense and the scope of the present teachings is defined by the appended claims and their equivalents.

Figure 1:
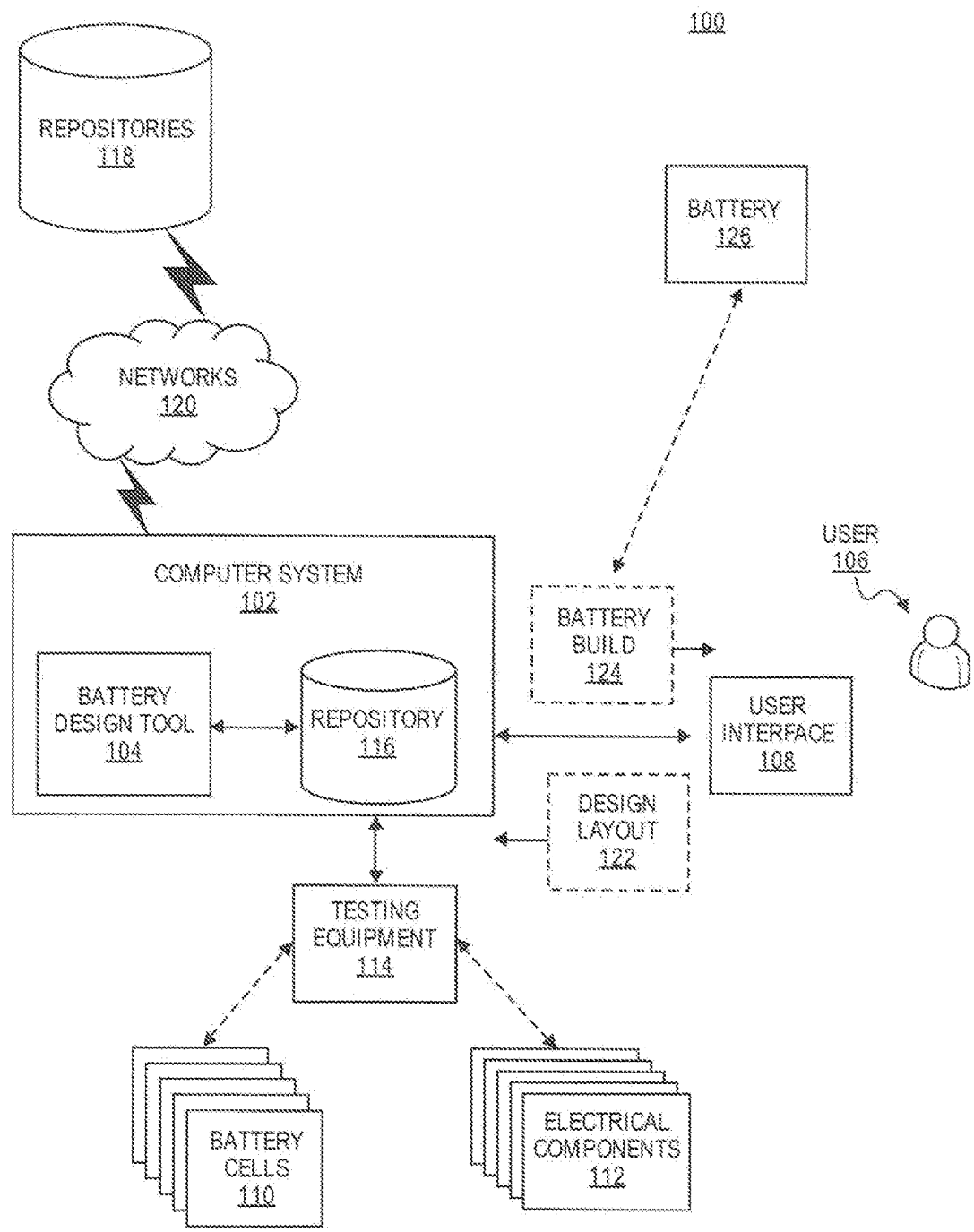
FIG. 1 illustrates an example of a design environment and computer system that includes a battery design tool, according to various aspects of the present disclosure.
Figure 2:
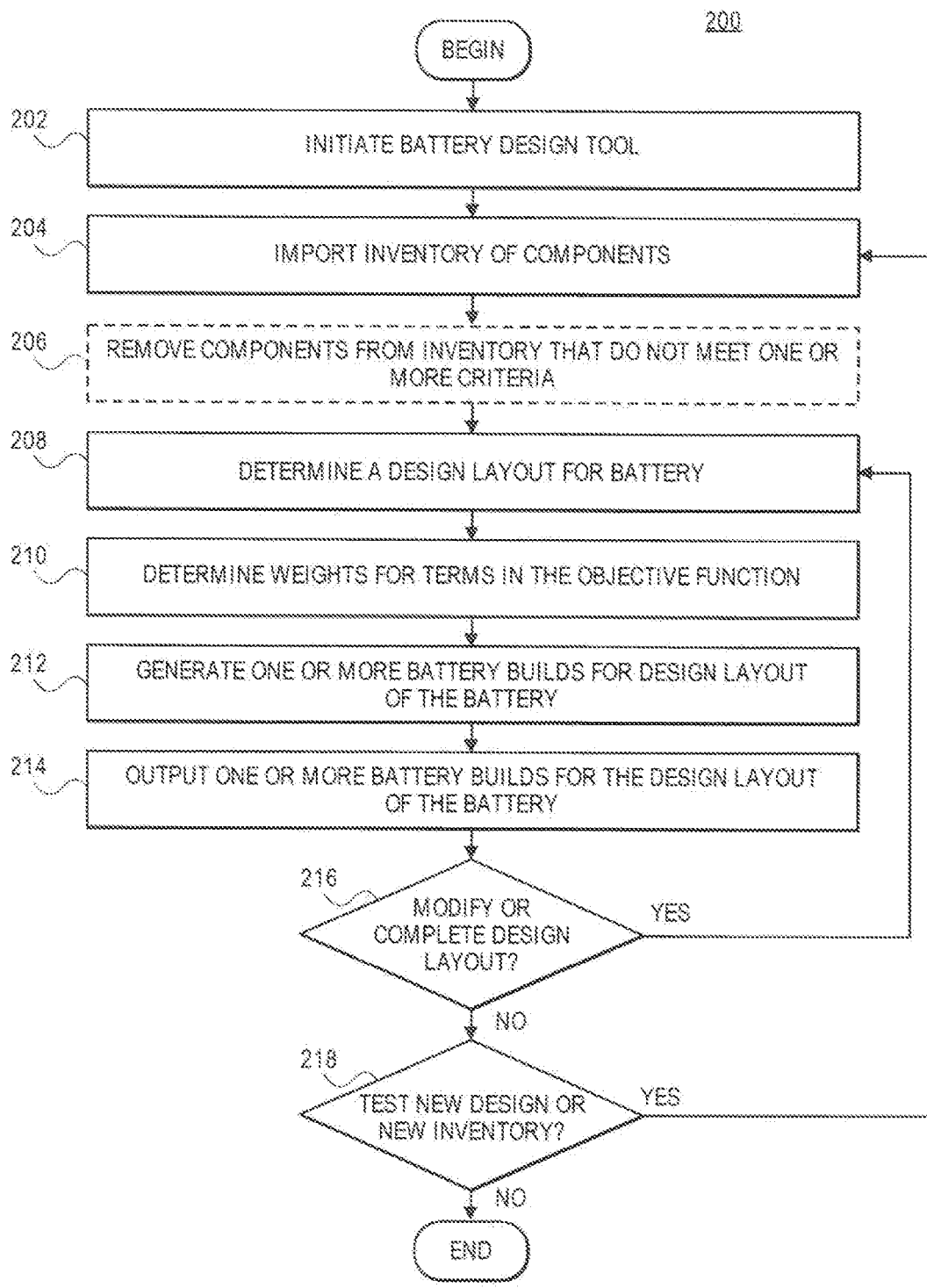
FIG. 2 and FIGS. 3A-3C illustrate examples of processes of designing a battery, according to various aspects of the present disclosure.

FIG. 1 illustrates a design environment 100 in which a battery layout can be tested and determined, according to aspects of the present disclosure. While FIG. 1 illustrates various components contained in the design environment 100. FIG. 1 illustrates one example of a design environment and additional components can be added and existing components can be removed.

As illustrated in FIG. 1, the design environment 100 includes a computer system 102. The design environment 100 can represent the computer systems and network hardware of public or private entities, such as governmental agencies, individuals, businesses, partnerships, companies, corporations etc., utilized to support the entities. The computer system 102 can be any type of conventional computer system that is operating in the design environment 100 or supporting the design environment 100. For example, the computer system 102 can include various types of servers, such as file servers, web servers, application servers, database servers, email servers and the like, that provide services within the design environment 100. Likewise, for example, the computer system 102 can include laptop computers, desktop computers, tablet computers, mobile phones, and the like used by the personnel of the entities.

Additionally, for example, the design environment 100 includes other hardware and computer systems that support the design environment 100. For example, the design environment 100 can include gateways, routers, wireless access points, firewalls, and the like that support any type of communications network to allow the computing systems in the design environment 100 to communicate. In any of the examples, the computer systems, including the computer system 102, in the design environment 100 include hardware resources, such as processors, memory, network hardware, storage devices, and the like, and software resources, such as operating systems (OS), application programs, and the like.

According to aspects of the present disclosure, the computer system 102 is configured to execute a battery design tool 104. The battery design tool 104 is configured to screen and match components, for example, battery cells 110 and electrical components 112, in a battery design layout 122 that includes multiple battery cells and electrical components. The electrical components 112 may include a plurality of one or more of fuses, pass transistors, diodes, thermosensors, and an indicator.

The battery design tool 104 is configured to generate one or more battery builds 124 for the battery design layout of the battery 126. The one or more battery builds 124 can represent an identification of a specific component or components to be used at each location of the battery design layout. In aspects, the battery design tool 104 can utilize one or more iterative algorithms to determine the one or more battery builds 124. In the one or more of the iterative algorithms, the battery design tool 104 can utilize a simulated annealing algorithm. In the simulated annealing algorithm, the battery design tool 104 can perform a local search of the solution space for the battery design layout. In the local search, the battery design tool 104 can select an initial test solution that includes a random or pseudorandom placement of individual electrical components (e.g., cells, fuses, etc.) in the battery design layout. The battery design tool 104 can swap one or more components in the test solution build to create a possible solution to the battery design layout. The battery design tool 104 can then determine the quality of the possible solution by evaluating objective function value. Once evaluated, the best solution and working solution can be set to the possible solution if its objective function value is equal to or better than the objective function value of the current best solution. The possible solution can also replace the current working solution with a certain probability if objective function value is worse than the objective function value of the current working solution. The battery design tool 104 can then repeat the processes by swapping one or more new components. To guide the search, the previously selected components (e.g., serial numbers of the previously selected components) can be added to a tabu list. Components on the tabu list may not move locations for a specified number of iterations of the local search. Through each iteration of the local search, the test solution can be added to an elite solution list if it is of higher quality than the previously stored solutions and maintains diversify in the elite solution set.

In addition to the local search, the battery design tool 104 can also perform diversification and intensification within the algorithm. During the diversification stage, the battery design tool 104 can move to an area of the solution space that has not been explored or has been explored minimally. The battery design tool 104 can perform the local search in this area of the solution space. During the intensification stage, the battery design tool 104 can more intensely explore areas of the solution space where high quality solutions have been observed.

By using the local search, the battery design tool 104 can determine and produce an optimal battery build with increased efficiency and reduced computation time and power. Likewise, by utilizing local search, a tabu list, diversification and intensification, the battery design tool 104 covers a large solution space while reducing the computational time and power to calculate the optimal battery build.

In aspects, the battery design tool 104 is configured as a software program that is capable of being stored on and executed by the computer system 102. The battery design tool 104 can be written in a variety of programming languages, such as JAVA, C++, Python code, Visual Basic, hypertext markup language (HTML), extensible markup language (XML), and the like to accommodate a variety of operating systems, computing system architectures, etc.

The battery design tool 104 is configured to operate, at least partially, under the control of a user 106. To receive input and output results to the user 106, the battery design tool 104 is configured to generate and provide a user interface 108. The user interface 108 can be any type of command line and/or graphical user interface (GUI) that allows the user 106 to interact with the battery design tool 104. The battery design tool 104 is configured to provide, via the user interface 108, controls, forms, reports, etc., to allow the user 106 to interact with the battery design tool 104 and perform the processes described herein.

In aspects, the operational parameters utilized by the battery design tool 104 can include any information and metrics that describe an actual operational performance of the components, e.g., the battery cells 110 and the electrical components 112. For example, the operational parameters of the battery cells can include capacity, impedance, ampere-hour rating of the battery cell, internal resistance of the battery, the open circuit voltage of the battery, state of charge of the battery, etc. For example, the operational parameters of the electrical components can include equivalent resistance at different temperatures and impedance at different temperatures. In aspects, the battery design tool 104 can be configured to utilize operational parameters and data that are created, transmitted or stored in any format, for example, Arbin, Maacor. etc.

In some aspects, the operational parameters can be received from manufacturers of the components, e.g., theoretical operational parameters. In some aspects, the operational parameters can be determined by a third party or separate computer system and provided to the computer system 102 and the battery design tool 104. In some aspects, the operational parameters can be determined by the computer system 102 and the battery design tool 104.

For example, to determine the operational parameters, the computer system 102 can be coupled to testing equipment 114. The testing equipment 114 can include electronics and circuits that place the battery cells 110 and the electrical components 112 under real-world operational conditions. The testing equipment 114 can also include one or more sensors that measure the operational parameters of the battery cells 110 and the electrical components 112 under the real-world operational conditions. Additionally, for example, the operational parameters can also include parameters calculated from the measured data such as IR trends and capacity trends.

In aspects, the computer system 102 includes a repository 116. The repository 116 can be configured to store data utilized by the battery design tool 104. For example, the repository 116 can store the operational parameters determined by the battery design tool 104 utilizing the testing equipment 114. Likewise, for example, the repository 116 can store databases that include an inventory or components, e.g., the battery cells 110 and the electrical components 112, and details of the battery cells 110 and the electrical components 112 such as identification of each of the battery cells 110 and electrical components 112 (e.g. serial number), the specifications of the battery cells 110 and the electrical components 112, and theoretical operational parameters of the battery cells 110 and the electrical components 112 (e.g. manufacturer designated operational parameters).

In aspects, the computer system 102 can be coupled to one or more repositories 118 via one or more networks 120. For example, the repositories 118 can be operated and maintained by manufactures of the components, e.g., the battery cells 110 and the electrical components 112. The battery design tool 104 can be configured to retrieve, via a network 120, details of the components, e.g., the battery cells 110 and the electrical components 112 from the repositories 118. The network 120 can be any type of network whether public or private. The repository 118 can be any type of computer system that stores information about the components.

FIG. 2 and FIGS. 3A-3C illustrate examples of processes 200 and 300 for designing a battery from components, according to aspects of the present disclosure. While FIG. 2 and FIGS. 3A-3C illustrate various stages that can be performed, stages can be removed and additional stages can be added. Likewise, the order of the illustrated stages can be performed in any order.

After the process begins, in 202, the battery design tool 104 is initiated. For example, the user 106 can initiate execution of the battery design tool 104 on the computer system 102. Once initiated, the battery design tool 104 can provide the user interface 108 to the user 106. The user interface 108 can allow the user 106 to operate the battery design tool 104.

In 204, the battery design tool 104 imports an inventory of components. The components can include battery cells and electrical components such as fuses, resistors, capacitors, etc. The inventor of components can include an identification (e.g., serial number) of the components and details of the components (e.g., operational parameters of the components). For example, the battery design tool 104 can communicate with the testing equipment 114 to determine the operational parameters of the components, e.g., the battery cells 110 and the electrical components 112. Likewise, for example, the battery design tool 104 may have previously tested the components and can retrieve the operational parameters for the components that were previously tested. Likewise, the battery design tool 104 can retrieve (or can have previously retrieved) the theoretical operational parameters of the components, e.g., the battery cells 110 and the electrical components 112 (e.g. manufacturer designated operational parameters). In an example, as further described below, the components in inventory can include battery cells, fuses, or other electrical components.

In 206, the battery design tool 104 optionally removes components from inventory that do not meet one or more criteria. For example, the battery design tool 104 can maintain one or more criteria for the operational parameters. The one or more criteria can be preset in the battery design tool 104. Likewise, the one or more criteria can be selected or set by the user 106, via the user interface 108. The decision to perform the removal of inventory can be preset in the battery design tool 104. Likewise, the decision to perform the removal of inventory can be selected or set by the user 106, via the user interface 108.

For example, the user 106 can instruct the battery design tool 104 to filter components from the inventory that do not have operational parameters within a certain criteria, for example, operational parameters within a certain standard deviation (e.g., 1, 2, or 3, sigmas). In response, the battery design tool 104 can remove the components from the inventory when determining the battery design layout.

In an example as further as described below, the battery design layout can include both battery cells and bases and the operational parameters can include:
1. Cell capacity,
2. Cell impedance and
3. Fuse impedance.

In 208, the battery design tool 104 determines a design layout for a battery. In aspects, the design layout for a battery can include a structure of the battery (e.g., a circuit diagram or configuration) that is composed of components, e.g., battery cells and electrical components, to provide a desired performance for the battery. The design layout for the battery can also include a number, typo, location, etc. of components that are to be included in the battery. For example, the circuit diagram can include components such as battery cells and electrical components in various electrical arrangements (e.g. series and parallel circuit configurations) to provide a desired performance for the battery (e.g. a desired output voltage, current, lifetime, etc.)

In some aspects, the battery design tool 104 can determine and utilize a design layout for the battery that is a complete design layout. For example, if the design layout is a complete design layout, the design layout can include the structure of the battery (e.g., a circuit diagram or configuration)

and a complete specification (e.g., number, type, location etc.) of the components, e.g., the battery cells 110 and the electrical components 112, to be included in the structure of the battery.

In some aspects, the battery design tool 104 can determine and utilize a design layout for the battery that is a partial design layout. For example, if the design layout is a partial design layout, the design layout can include a partial structure of the battery (e.g., a circuit diagram or configuration); a partial specification of the components, e.g., the battery cells 110 and the electrical components 112, to be included in the structure of the battery, or combination thereof. For instance, in one example, the design layout can include the structure of the battery (e.g., a circuit diagram or configuration) and a specification (e.g., number, type, location, etc.) of battery cells to be included in the structure of the battery but not specify other electrical components to be included in the structure (e.g., fuses). In another example, the design layout can include the structure of the battery (e.g., a circuit diagram or configuration) and a specification (e.g., number, type, location, etc.) of electrical components to be included in the structure (e.g., fuses) to be included in the structure of the battery but not specify the battery cells.

In aspects, the user 106 can input or select, via the user interface 108, a design layout for a battery. For example, the user 106 can input, via the user interface 108, the structure of the battery (e.g., a circuit diagram or configuration), the specification (e.g., number, type, location etc.) of the components, e.g., the battery cells 110 and the electrical components 112, to be included in the structure of the battery, or combination thereof. The user 106 can input, via the user interface 108, a complete design layout for a battery, a partial design layout for the battery, or combination thereof. In some aspects, for example, the battery design tool 104 can provide, via the user interface 108, a circuit design interface that allows the user 106 to design the structure for the battery and partially or completely provide the specification of the components.

Likewise, for example, the user 106 can select, via the user interface 108, the structure of the battery (e.g., a circuit diagram or configuration), the specification (e.g., number, type, location etc.) of the components, e.g., the battery cells 110 and the electrical components 112, to be included in the structure of the battery, or combination thereof. The user 106 can select, via the user interface 108, a complete design layout for a battery, a partial design layout for the battery, or combination thereof. In one example, the user 106 can select the structure of the battery (e.g., a circuit diagram or configuration) and input either a partial or complete specification of the electrical components. For example, the battery design tool 104 can store one or more design layouts for different battery configurations, and the user 106 can select one or more of the stored design layouts.

In aspects, the user 106, via the user interface 108, can select a complete layout or a partial layout that was previously evaluated by the battery design tool 104 for completion, modification, or revision. In one example, the user may have previously input or selected a complete layout and generated a battery build. In another example, the user 106 may have previously input or selected a partial layout that included a specification (e.g., number, type, location, etc.) of battery cells to be included in the structure of the battery but not specify other electrical components to be included in the structure (e.g., fuses), and a battery build may have been generated by the battery design tool 104. Likewise, in another example, the user 106 may have previously input, or selected a partial layout that titled a specification (e.g., number, type, location, etc.) of electrical components to be included in the structure (e.g., fuses) of the battery but not specify the battery cells, and a battery build may have been generated by the battery design tool 104. In any example, the battery design tool 104 can store the complete or partial layout including the battery build determined by the battery design tool 104. The user 106, via the user interface 108, can select the stored complete or the stored partial layout that was previously evaluated by the battery design tool 104 for completion or revision, for example, by inputting a specification of the battery cells, electrical components, or combination thereof. This may allow the user to partially generate an optimized battery build for available components and complete the partial design layout once additional components are available, new components are manufactured, requirements of the battery change, etc. Likewise, this may allow the user to generate a complete optimized battery build and revise or modify the design layout at a later time, for example, as new components are manufactured, requirements of the battery change, etc.

In aspects, the user 106 can input requirements for the battery, and the battery design tool 104 can automatically generate a design layout, whether partial or complete, for a battery.

Figure 4A:
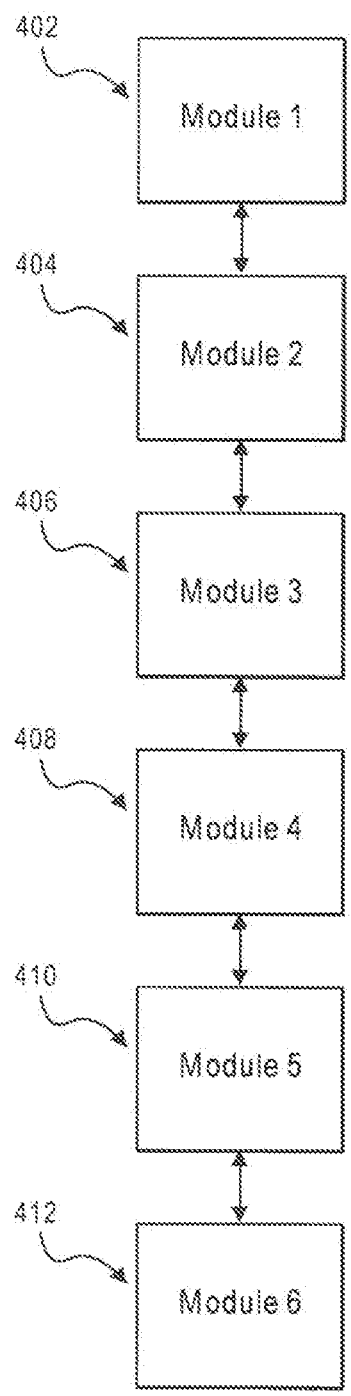
FIGS. 4A and 4B illustrate examples of a design layout for a battery, according to various aspects of the present disclosure.
Figure 4B:
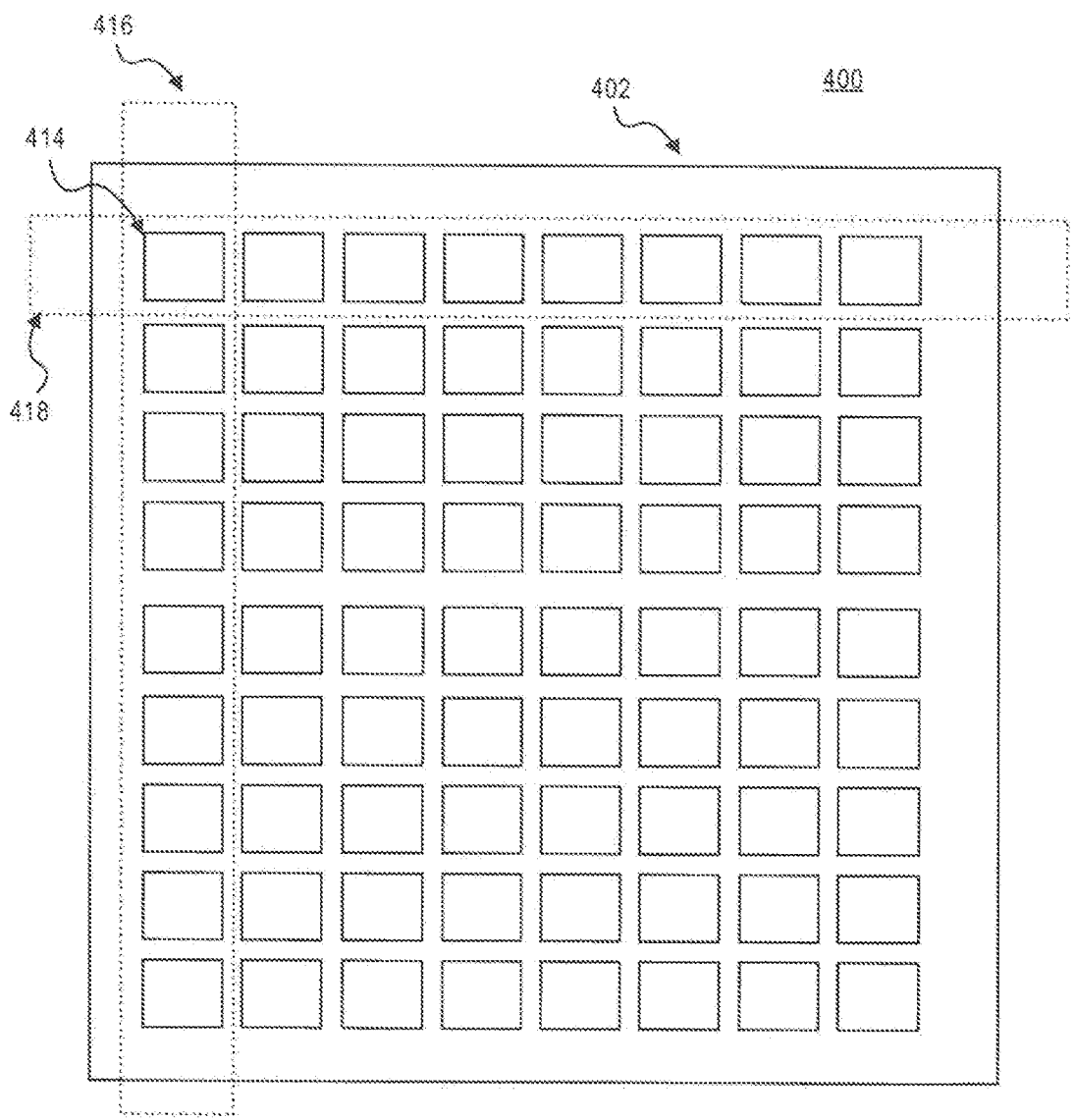

FIGS. 4A and 4B illustrate an example of a design layout for a battery. For example, as illustrated in FIG. 4A, a design layout 400 for a battery can consist of six (6) modules: Module 1 402, Module 2 404, Module 3 406, Module 4 408, Module 5 410, and Module 6, 412. The six modules can be coupled, for example, in series to produce a desired voltage and current for the battery. While illustrated as being coupled in series, the six modules can, be coupled in any configuration, e.g., series, parallel, or combinations thereof.

In this example, one or more components can be placed within a module at a specific location 414 and each location must be occupied. Each module can include a number of locations 414 arranged in rows and columns. For example, the Module 1 402 can include 72 locations 414 arranged in rows 416 and columns 418, as illustrated in FIG. 4B. In this example, the location can receive one or more components, e.g., a battery cell, a fuse, other electrical components, or combinations thereof. In aspects, the locations 414 can be coupled in any arrangement, e.g., series, parallel, or combination thereof. In aspects, Module 1 402, Module 2 404, Module 3 406, Module 4 408, Module 5 410, and Module 6, 412 can have the same arrangements and locations. Likewise, in aspects, Module 1 402, Module 2 404, Module 3 406, Module 4 408, Module 5 410, and Module 6, 412 can have different arrangements and locations.

The location 414, within a module, can be described as a row/column pairing. In this example, each row can be described as a virtual cell. For example, the locations in a row may be connected to form a virtual cell. Each location at a column location can be termed a cell. In this example, each cell can comprise a battery cell or a battery cell and a fuse. As will be discussed below, the following notation can be used to described the design layout

TABLE 1

| Notation | Description | Range |
|---|---|---|
| n | Battery Cell | 1 ... N |
| f | Fuse | 1 ... F |
| i | Module | 1 ... I |
| j | Virtual Cell (row) | 1 ... J |
| k | Cell (in virtual Cell) | 1 ... K |

In this example, as discussed above, the design layout 400 can be complete or partial. For example, the specification (location, type, number, etc.) of the battery cells and the specification (location, type, number, etc.) of the fuses may be included in the design layout 400. In another example, the specification (location, type, number, etc.) of the battery cells may be included in the design layout 400, and the specification (location, type, number, etc.) of the fuses may not be included. In another example, the specification (location, type, number, etc.) of the fuses may be included in the design layout 400, and the specification (location, type, number, etc.) of the battery cells may not be included.

In 210, the battery design tool 104 determines weights for terms in the objective function. The weights for terms in the objective function can be preset in the battery design tool 104. Likewise, the user 106 can input, via the user interface 108, the weights for the terms in the object function.

For example, the weights for terms in the objective function can represent an importance of each term in the objective function in the battery design layout. The terms in the objective function can include a criteria that describes a desired performance of the battery design layout. The terms in the objective function can include, for example, minimize the difference in capacity across all virtual cells, minimize the difference in impedance within each virtual cell, and minimize the difference in impedance across all modules.

In one example, the battery design tool 104 can determine process parameters for process 200. The process parameters, for example, can include settings and constraints used in the processes as further described below with reference to FIGS. 2 and 3A-3C. The process parameters cane preset in the battery design tool 104. Likewise, the user 106 can input, via the user interface 108, the process parameters.

In 212, the battery design tool 104 generates one or more battery builds for the battery design layout of the battery. The one or more battery builds can represent an identification of a specific component or components to be used at each location of the battery design layout. In aspects, the battery design tool 104 can utilize one or more iterative algorithms to determine the one or more battery builds, as described below in FIGS. 3A-3C. In the one or more of the iterative algorithms, the battery design tool 104 can utilize a simulated annealing algorithm. In the simulated annealing algorithm, the battery design tool 104 can perform a local search of the solution space for the battery design layout. In the local search, the battery design tool 104 can select an initial test solution that includes a random or pseudorandom placement of individual electrical components (e.g., cells, fuses, etc.) in the battery design layout. The battery design tool 104 can swap one or more components in the test solution build to create a possible solution to the battery design layout. The battery design tool 104 can then determine the quality of the possible solution by evaluating the objective function value. Once evaluated, the best solution and working solution can be set to the possible solution if its objective function value is equal to or better than the objective function value of the current best solution. The possible solution can also replace the current working solution with a certain probability if objective function value is worse than the objective function value of the current working solution. The battery design tool 104 can then repeat the processes by swapping one or more new components. To guide the search, the previously selected components (e.g., serial numbers of the previously selected components) can be added to a tabu list. Components on the tabu list may not move locations for a specified number of iterations of the local search. Through each iteration of the local search the test solution can be added to an elite solution list if it is of higher quality than the previously stored solutions and maintains diversify in the solution set.

In addition to the local search, the battery design tool 104 can also perform diversification and intensification within the algorithm. During the diversification stage, the battery design tool 104 can move to an area of the solution space that has not been explored or has been explored minimally. The battery design tool 104 can perform the local search in this area of the solution space. During the intensification stage, the battery design tool 104 can more intensely explore areas of the solution space where high quality solutions have been observed.

Figure 3A:
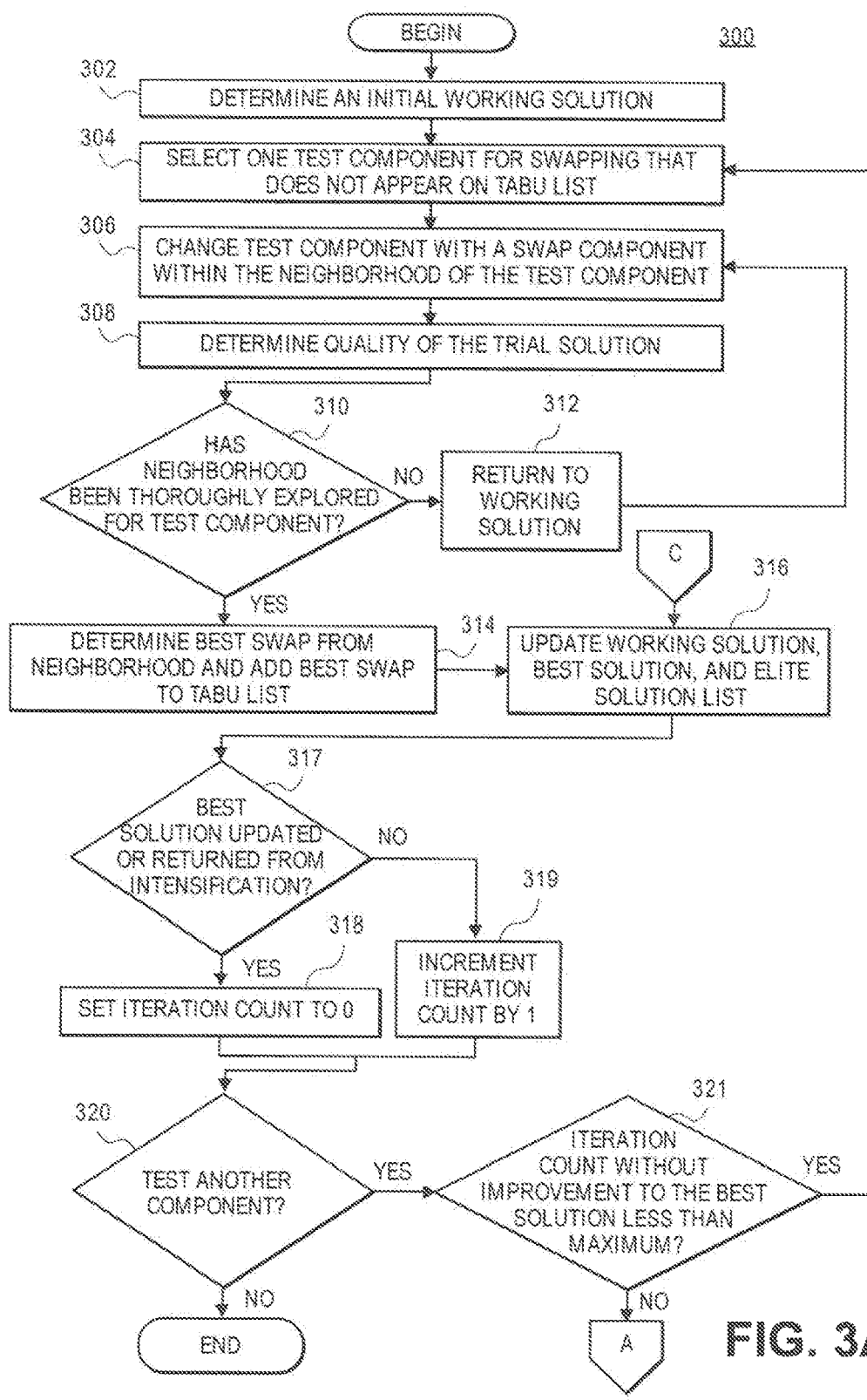
Figure 3B:
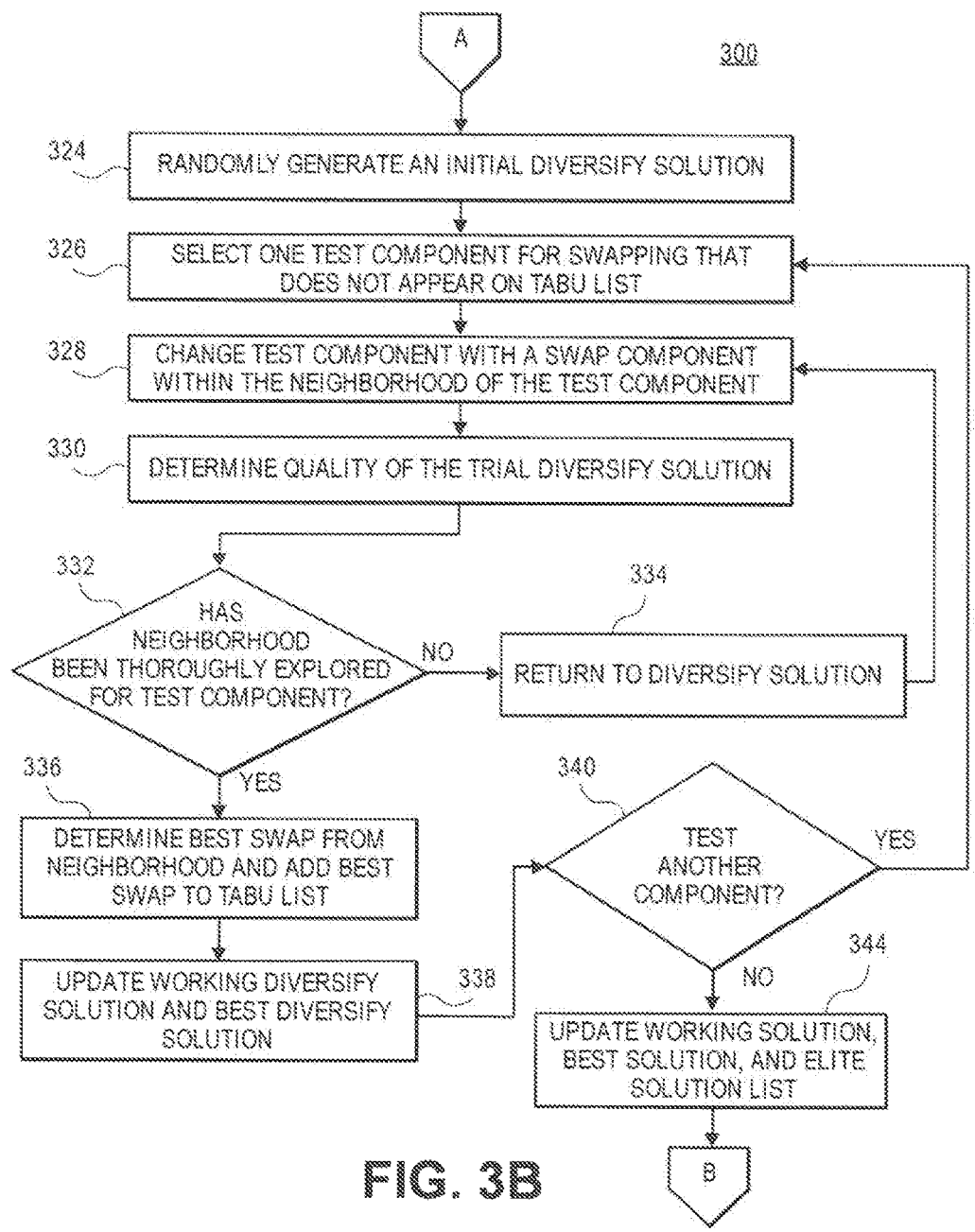
Figure 3C:
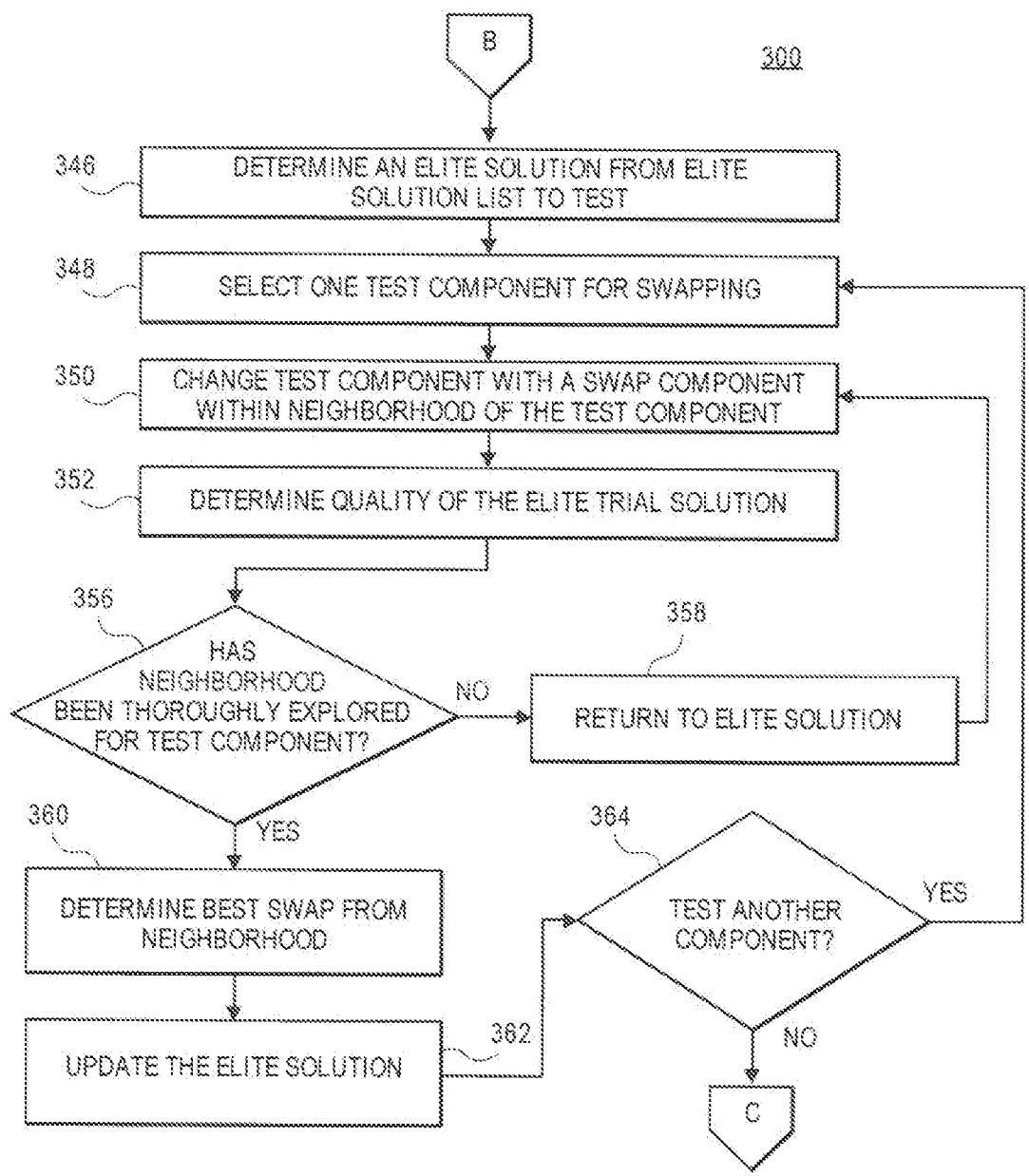

FIGS. 3A-3C illustrate an example process 300 for determining one or more solutions to the battery design layout. As illustrated in FIG. 3A, after the process begins, in 302, the battery design tool 104 determines an initial working solution for the battery design layout. The initial working solution can be set as the working solution for the testing process. The working solution can be the solution for the battery design layout that is undergoing going current testing by the process 300.

The battery design tool 104 can select different components from the inventory to place at the location of the battery design layout. For example, the battery design tool 104 can select different serial numbers of the components from the inventory and record the serial numbers at different locations of the battery design layout. The battery design tool 104 can select the placement of different components at random. Likewise, the battery design tool 104 can select the placement of different components based on set of component characteristics. For example, the battery design tool 104 can select the placement of different components based on similarity in operational parameters, similarity in manufacturers, historical performance of components, previous solutions to battery design layouts, and the like.

In 304, the battery design tool 104 selects one or more test components for swapping that does not appear on the tabu list. The battery design tool 104 can select one or more serial numbers of the initial working solution and compare the number to the tabu list. For example, in the case of one test component, the battery design tool 104 can select a serial number, e.g., "000100," compare the serial number of the component to the tabu list, and select the component if the serial number is not on the tabu list. The battery design tool 104 can select the serial number at random. Likewise, the battery design tool 104 can select the serial number based on a set of component characteristics. For example, the battery design tool 104 can select the test component based on operational parameters, manufacturers, historical performance of components, previous solutions to battery design layouts, and the like.

In 306, the battery design tool 104 changes the test component with a swap component within the neighborhood of the test component. The battery design tool 104 can change the test component with the swap component within the neighborhood of the test component to create a trial solution. The neighborhood can include serial numbers that are associated with the type of the test component. For example, if the test component serial number is associated with a fuse, then the battery design tool 104 can select a component with a serial number associated with a fuse for swapping. The swap component may be assigned to a location in the working solution. If the swap component is assigned to a location in the working solution, the battery design tool 104 can swap the test component and the swap component at that respective location. Likewise, the swap component may be in the inventory of components not used in the working solution. If the swap component is not assigned to a location in the working solution, the battery design tool 104 can swap the test component at the location with swap components from the unused inventory.

In 308, the battery design tool 104 determines a quality of the trial solution. The battery design tool 104 can determine the quality of the trial solution by calculating the objective function value for the trial solution. The terms in the objective function can include capacity of a unit cell, impedance of unit cell, impedance across all modules, and the like.

For example, in a battery, the capacity of a unit cell in a module can be defined by equation (1) and the capacity of a virtual cell can be defined by equation (2):

$$\text{unit cell capacity} = \text{cell capacity} \quad (1)$$

$$\text{virtual cell capacity} = \Sigma \text{unit cell capacity} \quad (2).$$

The Impedance of a unit cell in a module can be defined by equation (3), the impedance of a virtual cell can be defined by equation (4), the impedance of a module can be defined by equation (5):

$$\text{unit impedance} = \text{cell impedance} + \text{fuse impedance} \quad (3)$$

$$\frac{1}{\text{virtual cell impedance}} = \Sigma \frac{1}{\text{unit impedance}} \quad (4)$$

$$\text{module impedance} = \Sigma \text{virtual cell impedance} \quad (5)$$

The impedance across all modules can be given by the sum of the impendence of each module. The battery design tool 104 can determine the quality of the trial solution by examining the objective functions value. For example, a quality trial solution can be a trial solution that has an objective function value that minimizes the difference in capacity across all virtual cells, minimizes the difference in impedance within each virtual cell, minimizes the difference in impedance across all modules, or weighted combinations thereof. The battery design tool 104 can include a predetermined selection of the objective function to use and weights to be placed on each term of the objective function. Likewise, the battery design tool 104 can provide an interface, for example user interface 108, for the user to input the selection of the objective function to use and weights to be placed on terms of each objective function.

In 310, the battery design tool 104 determines if the neighborhood has been explored thoroughly for the test component. The battery design tool 104 can determine if the neighborhood of the test component has be adequately tested, that is, an adequate number of swaps with the test component have been evaluated. The battery design tool 104 can include a predetermined value, for the number of iterations required to test the neighborhood. Likewise, the battery design tool 104 can provide an interface, for example user interface 108, for the user to input the number of iterations to be considered.

If the neighborhood has been thoroughly explored in 310, the battery design tool 104 can return to the working solution in 312. The battery design tool 104 can return the components to the original location in the working solution.

Additionally, for example, before returning to the working solution, the battery design tool 104 can add the swap component to the tabu list and determine if the swap returned a higher quality solution than the current working solution. In determining whether to replace a working solution with the current trial solution, the battery design tool 104 can compare the current trial solution with the current working solution.

Then, the battery design tool 104 can return to 306 and change the test component with a new swap component and repeat the process. This allows more of the neighborhood around the test component to be tested for different swaps while not retesting solutions based on swap components on the tabu list.

If it is determined that the neighborhood has been thoroughly explored in 310, in 314, the battery design tool 104 determines a best swap from the neighborhood and adds the best swap to the tabu list.

In 316, the battery design tool 104 updates the working solution, the best solution, and elite solution list. The battery design tool 104 can determine whether the current working solution should be updated with the trial solution, based on a probability function and a cooling schedule. The probability function defines that the current working solution should be replaced by the trial solution based on a probability that is related to the quality of the current working solution when compared with trial solution. For example, if the objective function value of the current trial solution is better than that of the working solution, the battery design tool 104 can replace the working solution with the trial solution. The probability of updating the working solution with the trial solution decreases as the quality of the trial solution decreases relative to the quality of the working solution.

Additionally, the battery design tool 104 can update the best solution with the trial solution if the trial solution yields a better objective function value than that of the current best solution. Solutions can be stored as serial numbers and locations of the solution, determined in 314, and objective function values for the solution. The battery design tool 104 can maintain the elite solution list that includes one or more best or quality solutions from the search process. The elite solution list includes not only high quality solutions, but high quality solutions which are substantially diverse. In one example, the elite solution list may contain one best or quality solution, e.g., the solution with the best or quality objection function values. In another example, the elite solution list may contain multiple best or quality solutions, e.g., ten quality or best solutions determined in the iteration process. In these examples, the battery design tool 104 can rank the multiple best or quality solutions based on the objective function. For instance, the battery design tool 104 can store the best or quality solution with the best objective function value as the top ranked best or quality solution and the remaining best or quality solutions can be ordered according to the objective function value. In determining whether to replace a best or quality solution stored in the elite solution list with a new best or quality solution, the battery design tool 104 can compare the new best or quality solution with one or all of the best or quality solutions stored in the solution e.g., lowest ranked elite solution.

In 317, the battery design tool 104 determines if the best solution was updated or returned from the intensification process (in FIG. 3C). If the best solution was updated or returned from the intensification process, in 318, the iteration count is set to "0." If the best solution was not updated or returned from the intensification process, in 319, the iteration count is incremented by "1."

In 320, the battery design tool 104 determines if another component is to be tested. For example, the battery design tool 104 can test a neighborhood for a number of iterations. The battery design tool 104 can examine the iteration count to determine if the number of iterations has been performed.

The battery design tool 104 can include a predetermined value of the number of iterations. Likewise, the battery design tool 104 can provide an interface, for example user interface 108, for the user to input the value of the number of iterations. The battery design tool 104 can maintain components on the tabu list for a user-defined number of iterations. If another component is not to be tested, the process 300 can end.

If another component is to be tested, in 321, the battery design tool 104 determines if the iteration count without improvement to the best solution is less than a maximum. The search is required to generate improved results within a predefined or a user-defined number of iterations, prior to entering the intensification/diversification process. Once diversification/intensification is entered, the count starts over. The battery design tool 104 can determine whether the search process is providing better results or hasn't performed enough iterations. For example, if the current trial solution s better than the current working solution, the battery design tool can return to 304. By returning to 304, the battery design tool 104 can test a new neighborhood of the new working solution.

In 316 above, the probability function used to determine if the trial solution can replace the working solution can be further modified by a cooling schedule. The cooling schedule can be a modifier that alters the probability of updating the working solution with a lower quality trial solution based on how many iterations have been performed. For example, as the iterations begin, the cooling schedule can be "hot." In this case, the battery design tool 104 can have a higher probability of replacing the current working solution with a trial solution of lower quality. As more iterations are performed, the cooling schedule can "cool." In this case, the battery design tool 104 can have a lower probability of replacing the working solution with the trial solution, unless the current trial solution is of better quality.

If the search process is not generating improved results for a user-specified number of iterations, the battery design tool 104 proceeds to 324, as illustrated in FIG. 3B. FIG. 3B illustrates a diversification process, according to aspects of the present disclosure.

In 324, the battery design tool 104 randomly generates an initial diversify solution. The battery design tool 104 can select different components, from the inventory, to place at the locations of the battery design layout. For example, the battery design tool 104 can select different serial numbers of the components from the inventory and record the serial numbers at different locations of the battery design layout. The battery design tool 104 can select the placement of different components at random. The battery design tool 104 can select the placement of serial numbers with priority given to serial numbers that have moved minimally within the algorithm. The battery design tool 104 can examine previous solution processes and determine a number of components that have moved or swapped, have not been moved or swapped, or have been moved or swapped. For example, the battery design tool 104 can pseudo-randomly select components with the selections being weighted by how much a component has been moved or swapped, e.g., little or no moving or swapping with higher weight for selection. As such, the diversification process can examine parts of the solution space not previously explored at all or much. For example, the battery design tool 104 can determine that serial number, e.g., "100000," has not been moved or swapped and can select the serial number of the component.

In 326, the battery design tool 104 selects one test component for swapping that does not appear on the tabu list.

In 328, the battery design tool 104 changes the test component with a swap component within the neighborhood of the test component. The battery design tool 104 can change the test component with any swap component in the neighborhood or inventory. For example, the battery design tool 104 can change the test component with a swap component in the neighborhood. The neighborhood can include serial numbers that are of the same type as the test component. For example, if the test component is of type "fuse" then the battery design tool 104 can select a component with a serial number associated with a fuse for swapping. The swap component may be assigned to a location in the working diversify solution. If the swap component is assigned to a location in the working diversify solution, the battery design tool 104 can swap the test component and the swap component at the respective locations. Likewise, the swap component may be in the inventory of components not used in the working diversify solution. If the swap component is not assigned to a location in the working diversify solution, the battery design tool 104 can swap the test component at the location with swap components front the unused inventory.

In 330, the battery design tool 104 determines a quality of the trial diversify solution. The battery design tool 104 can determine the quality of the trial diversify solution by calculating the objective function value for the trial diversify solution, as discussed above.

In 332, the battery design tool 104 determine if the neighborhood has been thoroughly explored. The battery design tool 104 can determine if the neighborhood of the test component has be adequately tested, that is, an adequate number of swaps have been considered for the test component. The battery design tool 104 can include a predetermined value for the number of iterations required to test the neighborhood. Likewise, the battery design tool 104 can provide an interface, for example, user interface 108, for the user to input the number of iterations.

If the neighborhood has not been thoroughly examined as checked in 332, the battery design tool 104 can return to the working diversify solution in 334. The battery design tool 104 can return the components to the original location in the working diversify solution.

Additionally, for example, before returning to the working diversity solution, the battery design tool 104 can cache the current trial diversify solution as the best diversify solution. The best diversify solution can store the serial numbers and locations in the current best diversify solution and objective function value for the current trial diversify solution. The battery design tool 104 can maintain a working diversify solution and a best diversify solution that constantly tracks the best diversify solution navigated to thus far.

Then, the battery design tool 104 can return to 326 and change the test component with a new swap component and repeat the process. This allows the location neighborhood around the test component to be tested for different swaps while not retesting solutions based on swap components on the tabu list.

If it is determined that the neighborhood has been explored in 332, in 336, the battery design tool 104 determines a best swap from the neighborhood and adds the best swap to the tabu list.

In 338, the battery design tool 104 updates the working diversify solution and the best diversify solution. The battery design tool 104 can update the working diversify solution with the best neighborhood solution determined in 336. The battery design tool 104 can examine the working diversify solution and determine if it should replace the best diversify solution. A cooling schedule is utilized to assign a probability of replacing the current working diversify solution with the best neighborhood solution. Similarly, if the best neighborhood solution is of higher quality than the current best diversity solution then the best diversify solution is replaced by the best neighborhood solution. The best diversify and working diversify solutions are stored as serial numbers and locations along with their objective function values.

In 340, the battery design tool 104 determines if another component is to be tested. For example, the battery design total 104 can test different neighborhoods for a number of iterations. The battery design tool 104 can include a predetermined value of the number of iterations. Likewise, the battery design tool 104 can provide an interface, for example, user interface 108, for the user to input the value of the number of iterations. The battery design tool 104 can maintain the swap components on the tabu list toy some number of iterations. If another component is to be tested, the battery design tool 104 returns to 326.

If another component is not to be tested, in 344, the battery design tool 104 can update the working solution, the best solution, and the elite solution list based on the best diversify solution. For example, the battery design tool 104 can add the best diversify solution to the elite solution list. For example, if the best diversify solution is better quality than one or more solutions in the elite solution list, the battery design tool 104 can add the best diversify solution to the elite solution list and remove any solutions from the elite solution list, as necessary. Likewise, the battery design tool 104 can change the working solution to the best diversify solution via the utilization the cool schedule. Further more, the battery design tool 104 can update the best solution to the best diversify solution if the best diversify solution is of higher quality than the current best solution.

After the diversification process, in 346, the battery design tool 104 can perform an intensification process, as illustrated in FIG. 3C. In 346, the battery design tool 104 determines an elite solution from the elite solution list to test. For example, the elite solution can be a quality solution from the elite solution list, which contains a list of solutions providing quality objective function values, while maintaining difference from other solutions in the elite solution list.

In 348, the battery design tool 104 can select one or more serial numbers for swapping. The battery design tool 104 may not utilize the tabu list in the intensification process. For example, in the case of one test component, the battery design tool 104 can select a serial number, e.g., "000500." The battery design tool 104 can select the serial number at random.

In 350, the battery design tool 104 changes the test component with a swap component within the neighborhood of the test component. The neighborhood can include serial numbers that are of the same type as the test component. The swap component may be assigned to a location in the elite trial solution. If the swap component is assigned to a location in the elite trial solution, the buttery design tool 104 can swap the test component and the swap component at that respective location. Likewise, the swap component may be in the inventory of components not used in the elite solution. If the swap component is not assigned to a location in the elite solution, the battery design tool 104 can swap the test component at the location with swap components from the unused inventory.

In 352, the battery design tool 104 determines a quality of the elite trial solution. The battery design tool 104 can determine the quality of the elite trial solution by calculating the objective function value as discussed above.

In 356, the battery design tool 104 determines if the neighborhood has been thoroughly explored for the test component. If the neighborhood has not been completely explored, in 356, the battery design tool 104 can return to the elite solution in 358. The battery design tool 104 can return the components to the original location in the elite solution, and the battery design tool 104 can again test a location for the test component.

Then, the battery design tool 104 can return to 350 and change the test component with a new swap component and repeat the process. This allows the neighborhood around the test component to be tested for different swaps.

If it is determined that the neighborhood has been thoroughly explored in 356, in 360, the battery design tool 104 determines a best swap from the neighborhood. The battery design tool 104 can examine the working elite solution and update the working elite solution if the objective function of the elite trial solution is better than that of the working elite solution.

In 362, the battery design tool 104 updates the working elite solution. The battery design tool 104 can update the working elite solution with the best trial elite solution determined in 360.

In 364, the battery design tool 104 determines if another component is to be tested. For example, the battery design tool 104 can test different neighborhoods for a number of iterations. The battery design tool 104 can include a predetermined value of the number of iterations. Likewise, the battery design tool 104 can provide an interface, for example, user interface 108, for the user to input the value of the number of iterations. If another component is not to be tested, the process 300 can return to 316 illustrated in FIG. 3A and re-enter the flow described above.

Returning to FIG. 2, in 214, the battery design tool 104 outputs one or more battery builds for the design layout of the battery. For example, the battery design tool 104 can output one or more of the solutions stored in the elite solution list as the one or more battery builds. For example, in aspects, a battery build can include the identification of components that may be potentially used for the locations of the battery design layout of the battery. In some aspects, the battery design tool 104 can output a list of identifications (e.g., serial numbers) of components and indication of the location in the battery design layout. In some aspects, the battery design tool 104 can output the design layout that includes identifications (e.g., serial numbers) of components recorded on the design layout. The battery design tool 104 can also store the battery build and the design layout.

In 216, the battery design tool 104 can determine whether the design layout is to be modified or completed. For example, the user 106 may desire to modify the design layout and determine a new battery build. If so, the process may return to 208. Likewise, for example, the design layout may be a partial design layout and the user 106 may desire to complete the design layout. If so, the process may return to 208. Also, the battery design tool 104 can also store the battery build and the design layout for later evaluation and completion.

In the process 200, the battery design tool 104 can perform the optimization for different inventory of components and different battery design layouts. In 218, the battery design tool 104 can perform the matching process for different design layouts for the battery. In 218, the battery design tool 104 can determine whether to test a new design layout for the battery. If a new design layout is to be tested, the process 200 can return to 204. In 218, the battery design tool 104 can also determine whether to test a new inventory of components is to be tested. If a new inventory is to be tested, the process 200 can return to 204 and repeat the process of a new inventory of components. If a new design layout or new inventory is not tested, the process can end.

In the processes described above, the diversification and intensification can be optional processes. For example, the battery design tool 104 can be preconfigured to perform the diversification process. Likewise, the battery design tool 104 can provide an interface, for example, user interface 108, the user to select to perform diversification. Also, the battery design tool 104 can be preconfigured to perform the intensification process. Likewise, the battery design tool 104 can provide an interface, for example, user interface 108, for the user to select to perform intensification.

The foregoing description is illustrative, and variations in configuration and implementation can occur to persons skilled in the art. For instance, the various illustrative logics, logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but, in the alternative, the processor can be any conventional processor, controller, microcontroller, or state machine. A processor can also be implemented as a combination of computing devices, e.g., a combination or a DSP and a microprocessor, a plurality of microprocessors, one or more microprocessors in conjunction with a DSP core, or any other such configuration.

In one or more exemplary embodiments, the functions described can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various meals as is known in the art.

Figure 5:
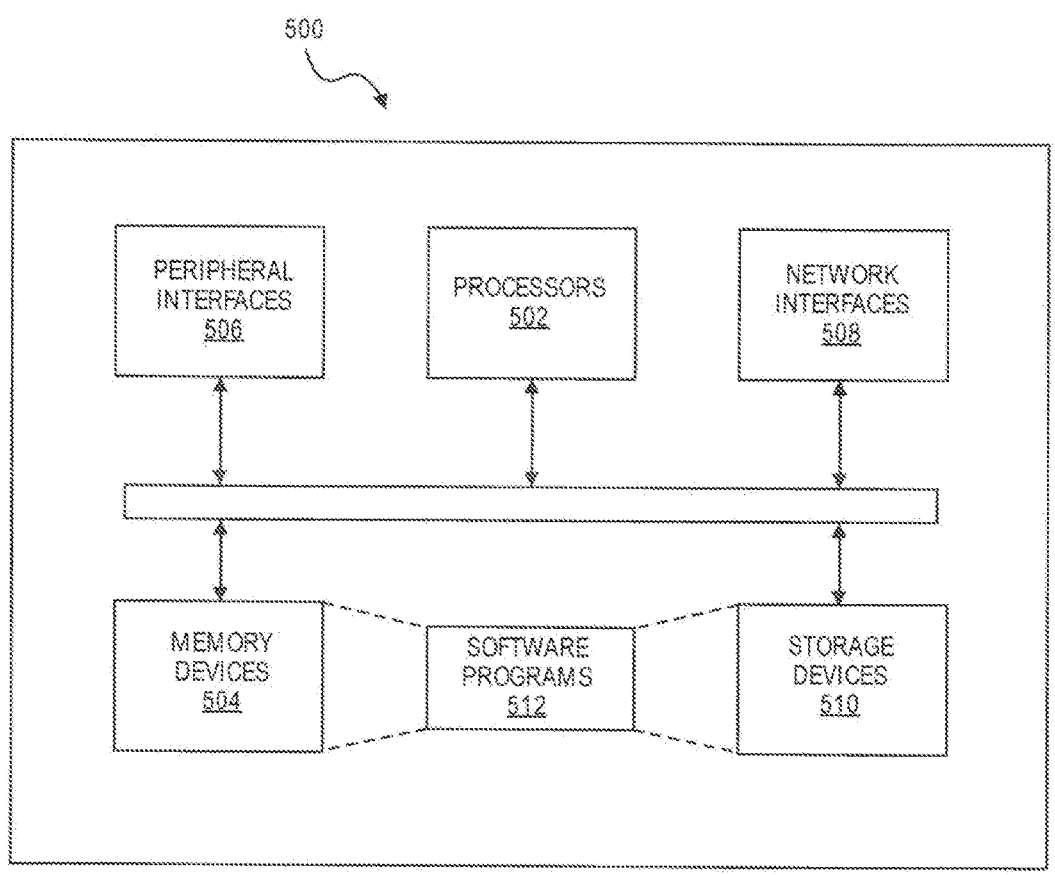
FIG. 5 illustrates an example of a hardware configuration for a computer device, according to various aspects of the present disclosure.

For example, FIG. 5 illustrates an example of a hardware configuration for the computer system 102. While FIG. 5 illustrates various components contained in the computer device 500. FIG. 5 illustrates one example of a computer device and additional components can be added and existing components can be removed.

The computer device 500 can be any type of computer device. As illustrated in FIG. 5, the computer device 500 can include one or more processors 502 of varying core configurations and clock frequencies. The computer device 500 can also include one or more memory devices 504 that sere as a main memory during the operation of the computer device 500. For example, during operation, a copy of the software that supports the battery design tool 104 can be stored in the one or more memory devices 504. The computer device 500 can also include one or more peripheral interfaces 506, such as keyboards, mice, touchpads, computer screens, touchscreens, etc., for enabling human interaction with and manipulation of the computer device 500.

The computer device 500 can also include one or more network interfaces 508 for communicating via one or more networks, for example the network 120, such as Ethernet adapters, wireless transceivers, or serial network components, for communicating over wired or wireless media using protocols. The computer device 500 can also include one or more storage devices 510 of varying physical dimensions and storage capacities, such as flash drives, hard drives, random access memory, etc., for storing data, such as images, files, and program instructions for execution by the one or more processors 502.

Additionally, the computer device 500 can include one or more software programs 512 that enable the functionality of the battery design too 104 described above. The one or more software programs 512 can include instructions that cause the one car more processors 502 to perform the processes described herein. Copies of the one or more software programs 512 can be stored in the one or more memory devices 504 and/or on in the on or more storage devices 510. Likewise, the data utilized by one or more software programs 512 can be stored in the one or more memory devices 504 and/or on in the one or more storage devices 510.

The computer device 500 can include a variety of data stores and other memory and storage media as discussed above. These can reside in a variety of locations, such as on a storage medium local to (and/or resident in) one or more of the computers or remote from any of all of the computers across the network. In some implementations, information can reside in a storage-area network (SAN) familiar to those skilled in the art. Similarly, any necessary files for performing the functions attributed to the computers, servers, or other network devices may be stored locally and/or remotely as appropriate.

In implementations, the components of the computer device 500 as described above need not be enclosed within a single enclosure or even located in close proximity to one another. Those skilled in the art will appreciate that the above-described componentry are examples only, as the computer device 500 can include any type of hardware componentry, including any necessary accompanying firmware or software, for performing the disclosed implementations. The computer device 500 can also be implemented in part or in whole by electronic circuit components or processors, such as application-specific integrated circuits (ASICs) or field-programmable gate arrays (FPGAs).

If implemented in software, the functions can be stored on or transmitted over a computer-readable medium as one or more instructions or code. Computer-readable media includes both tangible, non-transitory computer storage media and communication media including any medium that facilitates transfer of a computer program from one place to another. A storage media can be any available tangible, non-transitory media that can be accessed by a computer. By way of example, and not limitation, such tangible, lion-transitory computer-readable media can comprise a random access memory (RAM), a read only memory (ROM), a flash memory, an electrically erasable programmable read only memory (EEPROM), a compact disc read only memory (CD-ROM) or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), floppy disk and Blu-ray disc where disks usually reproduce data magnetically, while discs reproduce data optically with lasers. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above should also be included within the scope of computer-readable media.

Figure 6:
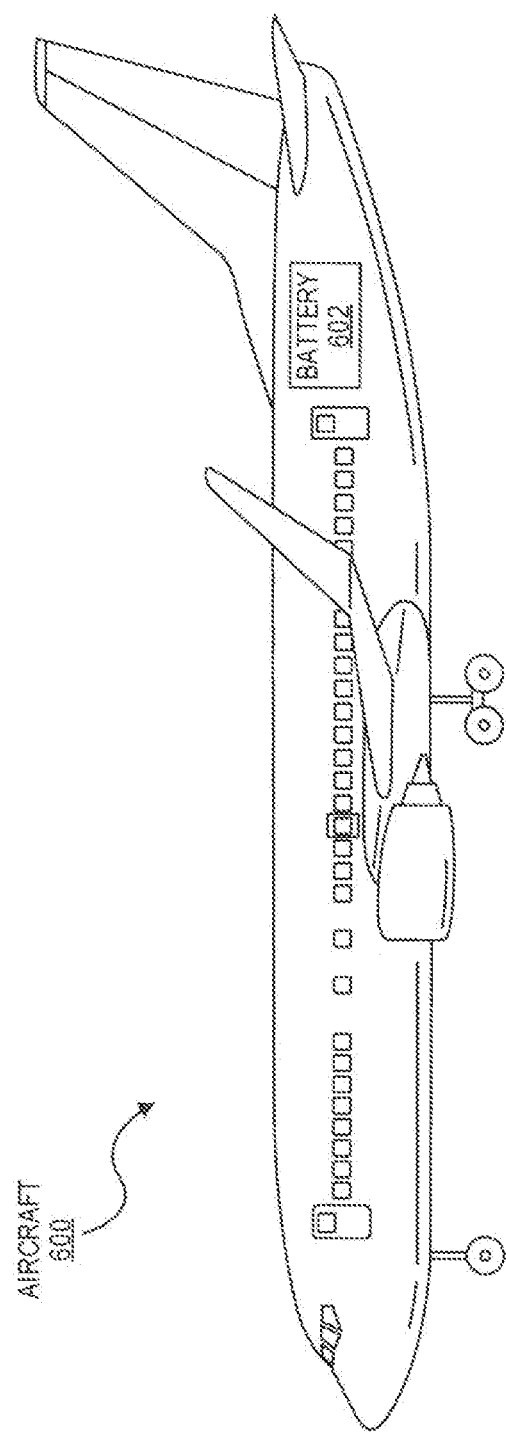
FIG. 6 illustrates an example of an application of the battery design tool, according to various aspects of the present disclosure.

In the aspects described above, the battery design tool 104 can be utilized to determine a design layout for a battery to be used in any type of application. FIG. 6 illustrates one example of an application for the battery design tool 104. As illustrated in FIG. 6, an aircraft 600 can include a battery 602. In aspects, the battery design tool 104 can be utilized to determine the design layout of the battery 602.

While the teachings have been described with reference to examples of the implementations thereof, those skilled in the art will be able to make various modifications to the described implementations without departing from the true spirit and scope. The terms and descriptions used herein are set forth by way of illustration only and are not meant as limitations. In particular, although the processes have been described by examples, the stages of the processes can be performed in a different order than illustrated or simultaneously. Furthermore, to the extent that the terms "including", "includes" "having", "has", "with", or variants thereof are used in the detailed description, such terms are intended to be inclusive in a manner similar to the term "comprising." As used herein, the terms "one or more of" and "at least one of" with respect to a listing of items such as, for example, A and B, means A alone, B alone, or A and B. Further, unless specified otherwise, the term "set" should be interpreted as "one or more." Also, the term "couple" or "couples" is intended to mean either an indirect or direct connection. Thus, if a first device couples to a second device, that connection can be through a direct connection, or through an indirect connection via other devices, components, and connections.

What is claimed is:

1. A method, comprising:
   determining operational parameters of an inventory of components to be included in a battery, wherein the components include storage components and electrical components;
   determining an initial working solution for a battery design layout for the battery, wherein the initial working solution comprises a set of components from the inventory of components assigned to locations in the battery design layout;
   determining, based on the initial working solution, two or more possible solutions for the battery design layout utilizing a local search algorithm,
   wherein the local search algorithm iteratively generates the two or more possible solutions from the initial working solution by swapping components from one or more components assigned to locations in the battery design layout with at least one of other components assigned to locations in the battery design layout and other components remaining in the inventory,
   wherein a tabu list stores identifications of one or more components that are not allowed to swap for a number of iterations of the local search algorithm,
   wherein a module comprises one or more virtual cells;
   wherein objective function values are calculated for each of the one or more possible solutions based on the operational parameters of components assigned to locations in the two or more possible solutions, wherein one or more terms in the objective function values are calculated for each of the two or more possible solutions by minimizing difference in capacity across all virtual cells in the battery, minimizing difference in impedance across all the modules comprising the virtual cells, or minimizing difference in impedance across all the virtual cells, and
   wherein the swapping components is determined at least partially based on the tabu list;
   performing a new local search based on a cooling schedule based on a probability of replacing a current solution with an updated solution as determined by a predetermined number of iterations of the local search algorithm that have been performed; and
   storing at least one of the two or more possible solutions;
   providing, via an interface to a user, a battery build selected from the two or more possible solutions based on the objective function values calculated for the two or more possible solutions; and
   testing, by an electrical battery testing equipment, physical battery cells based on the battery design layout under operating conditions.

2. The method of claim 1, the method further comprising:
   performing a diversification process for the battery design layout, wherein the diversification process generates one or more additional solutions in parts of a solution space minimally explored.

3. The method of claim 2, wherein the diversification process comprises:
   determining a new initial diversify solution to test; and
   determining, based on the new initial diversify solution, the one or more additional solutions for the battery design layout to consider for new working solutions.

4. The method of claim 1, the method further comprising: selecting one or more elite solutions from the two or more possible solutions; wherein the one or more elite solutions are of higher quality than a previously stored solution of the two or more possible solutions; and performing an intensification process on the one or more elite solutions.

5. The method of claim 1, wherein the storage components comprise a plurality of one or more of lithium ion (Li-ion) cells, nickel cadmium (NiCad) cells, and nickel metal hydride (NiMh) cells, and wherein the electrical components comprise include a plurality of one or more of fuses, pass transistors, diodes, thermosensors, and an indicator.

6. A system, comprising:
   one or more memory devices storing instructions; and
   one or more processors coupled to the one or more memory devices and configured to execute the instructions to perform a method comprising:
   determining operational parameters of an inventory of components to be included in a battery, wherein the components include storage components and electrical components;
   determining an initial working solution for a battery design layout for the battery, wherein the initial working solution comprises a set of components from the inventory of components assigned to locations in the battery design layout;

determining, based on the initial working solution, two or more possible solutions for the battery design layout utilizing a local search algorithm, wherein the local search algorithm iteratively generates the two or more possible solutions from the initial working solution by swapping components from one or more components assigned to locations in the battery design layout with at least one of other components assigned to locations in the battery design layout and other components remaining in the inventory, wherein a tabu list stores identifications of one or more components that are not allowed to swap for a number of iterations of the local search algorithm, wherein a module comprises one or more virtual cells;

wherein objective function values are calculated for each of the one or more possible solutions based on the operational parameters of components assigned to locations in the two or more possible solutions, wherein one or more terms in the objective function values are calculated for each of the two or more possible solutions by minimizing difference in capacity across all virtual cells in the battery, minimizing difference in impedance across all the modules comprising the virtual cells, or minimizing difference in impedance across all the virtual cells, and wherein the swapping components is determined at least partially based on the tabu list;

performing a new local search based on a cooling schedule based on a probability of replacing a current solution with an updated solution as determined by a predetermined number of iterations of the local search algorithm that have been performed; and storing at least one of the two or more possible solutions;

providing, via an interface to a user, a battery build selected from the two or more possible solutions based on the objective function values calculated for the two or more possible solutions; and testing, by an electrical battery testing equipment, physical battery cells based on the battery design layout under operating conditions.

7. The system of claim 6, the method further comprising: performing a diversification process for the battery design layout, wherein the diversification process generates one or more additional solutions in parts of a solution space minimally explored.

8. The system of claim 7, wherein the diversification process comprises:
determining a new initial diversify solution to test; and
determining, based on the new initial diversify solution, the one or more additional solutions for the battery design layout to consider for new working solutions.

9. The system of claim 6, the method further comprising: selecting one or more elite solutions from the two or more possible solutions; wherein the one or more elite solutions are of higher quality than a previously stored solution of the two or more possible solutions; and performing an intensification process on the one or more elite solutions.

10. The system of claim 6, wherein the storage components comprise a plurality of one or more of lithium ion (Li-ion) cells, nickel cadmium (NiCad) cells, and nickel metal hydride (NiMh) cells, and wherein the electrical components comprise include a plurality of one or more of fuses, pass transistors, diodes, thermosensors, and an indicator.

11. A non-transitory computer readable medium storing instructions for causing one or more processors to perform a method, the method comprising:

determining operational parameters of an inventory of components to be included in a battery, wherein the components include storage components and electrical components;

determining an initial working solution for a battery design layout for the battery, wherein the initial working solution comprises a set of components from the inventory of components assigned to locations in the battery design layout;

determining, based on the initial working solution, two or more possible solutions for the battery design layout utilizing a local search algorithm, wherein the local search algorithm iteratively generates the two or more possible solutions from the initial working solution by swapping components from one or more components assigned to locations in the battery design layout with at least one of other components assigned to locations in the battery design layout and other components remaining in the inventory, wherein a tabu list stores identifications of one or more components that are not allowed to swap for a number of iterations of the local search algorithm, wherein a module comprises one or more virtual cells;

wherein objective function values are calculated for each of the one or more possible solutions based on the operational parameters of components assigned to locations in the two or more possible solutions, wherein one or more terms in the objective function values are calculated for each of the two or more possible solutions by minimizing difference in capacity across all virtual cells in the battery, minimizing difference in impedance across all the modules comprising the virtual cells, or minimizing difference in impedance across all the virtual cells, and wherein the swapping components is determined at least partially based on the tabu list;

performing a new local search based on a cooling schedule based on a probability of replacing a current solution with an updated solution as determined by a predetermined number of iterations of the local search algorithm that have been performed; and storing at least one of the two or more possible solutions;

providing, via an interface to a user, a battery build selected from the two or more possible solutions based on the objective function values calculated for the two or more possible solutions; and testing, by an electrical battery testing equipment, physical battery cells based on the battery design layout under operating conditions.

12. The non-transitory computer readable medium of claim 11, the method further comprising:
performing a diversification process for the battery design layout, wherein the diversification process generates one or more additional solutions in parts of a solution space minimally explored.

13. The non-transitory computer readable medium of claim 12, wherein the diversification process comprises:
determining a new initial diversify solution to test; and
determining, based on the new initial diversify solution, the one or more additional solutions for the battery design layout to consider for new working solutions.

14. The non-transitory computer readable medium of claim 11, the method further comprising: selecting one or more elite solutions from the two or more possible solutions;

wherein the one or more elite solutions are of higher quality than a previously stored solution of the two or more possible solutions; and performing an intensification process on the one or more elite solutions.

15. The method of claim 1, wherein a weight for each objection function values is preset in the battery design layout.

16. The method of claim 1, wherein a weight for each objection function values is provided by the user in the battery design layout.

17. The system of claim 6, wherein a weight for each objection function values is preset in the battery design layout.

18. The system of claim 6, wherein a weight for each objection function values is provided by the user in the battery design layout.

19. The non-transitory computer readable medium of claim 11, wherein a weight for each objection function values is preset in the battery design layout.

20. The non-transitory computer readable medium of claim 11, wherein a weight for each objection function values is provided by the user in the battery design layout.

* * * * *